(12) United States Patent
Kitch

(10) Patent No.: US 6,413,872 B1
(45) Date of Patent: Jul. 2, 2002

(54) METHOD OP OPTIMIZING VIAS BETWEEN CONDUCTIVE LAYERS IN AN INTEGRATED CIRCUIT STRUCTURE

(75) Inventor: Vassili Kitch, San Ramon, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/641,096

(22) Filed: Aug. 17, 2000

(51) Int. Cl.[7] .............................................. H01L 21/00
(52) U.S. Cl. ...................... 438/692; 216/38; 438/720; 438/740; 438/742; 438/745
(58) Field of Search .................. 438/690, 691, 438/692, 693, 719, 720, 740, 742, 745, 756; 216/38, 88, 89

(56) References Cited

U.S. PATENT DOCUMENTS

| 4,917,759 | A |   | 4/1990 | Fisher et al. ................ 339/451 |
| 5,258,096 | A |   | 11/1993 | Sandhu et al. ............... 933/433 |
| 5,451,543 | A |   | 9/1995 | Woo et al. ................... 233/108 |
| 5,904,569 | A |   | 5/1999 | Kitch .......................... 438/692 |
| 6,117,781 | A | * | 9/2000 | Lukanc et al. .......... 438/723 X |
| 6,127,070 | A | * | 10/2000 | Yang et al. .............. 438/723 X |
| 6,277,757 | B1 | * | 8/2001 | Lin ........................ 438/723 X |

* cited by examiner

*Primary Examiner*—William A. Powell
(74) *Attorney, Agent, or Firm*—Stallman & Pollock LLP (57) ABSTRACT

A technique is provided for laying out vias between metal layers in an integrated circuit structure utilizing conventional Metal n and Metal N+1 databases. A first database (Metal n) is created that defines a lower conductive layer. A second database (Metal N+1) is created that defines an upper conductive layer. Selected intersections of the first database and the second database are then determined, thereby creating a third database (via n) that defines a pattern of vias between the lower conductive layer and the upper conductive layer. This allows interconnect vias to be optimized in size and shape, thus providing lowest possible interlayer resistance, which in turn provides the best possible circuit performance and reliability.

3 Claims, 6 Drawing Sheets

METHOD OP OPTIMIZING VIAS BETWEEN CONDUCTIVE LAYERS IN AN INTEGRATED CIRCUIT STRUCTURE

BACKGROUND OF THE INVENTION

1. Field of the Invention

The present invention relates to the manufacture of semiconductor integrated circuits and, in particular, to a method of forming conductive vias between conductive layers in an integrated circuit structure for maximum size, optimum shape and lowest possible via resistance.

2. Discussion of the Related Art

Integrated circuits commonly use multi-level conductive interconnects to reduce the layout area required for the tens or hundreds of thousands of active semiconductor devices that typically form an integrated circuit. This reduction in layout area is possible because the two or more conductive layers used in multi-level interconnect schemes are separated by dielectric layers that allow crisscrossing of the separated conductive layers without electrical shorting. Intentional connections between conductive layers separated by a dielectric are created by forming small apertures in the dielectric and filling the aperture with a conducting material such as aluminum. These connections, which are usually made between consecutive conductive layers, are known as vias.

As semiconductor device geometries continue to shrink into the submicron range, it is increasingly difficult to maintain planar conductive and dielectric surfaces during the formation of multi-level interconnect structure. This lack of planarity can cause several problems. For instance, if the underlying topography coated by a photoresist layer contains abrupt steps due to lack of planarity, the photoresist layer's thickness will not be uniform. This can occur, for example, when photoresist is applied to overlie features formed earlier in a semiconductor device process that protrude from the surface of a wafer. Photoresist cannot be applied uniformly over such a topography. This nonuniformity in thickness can lead to some regions of the patterned photoresist layer being inadequately thick to protect underlying features during a later etching step and other regions being excessively thick so that the full thickness of the photoresist layer cannot be exposed due to the depth-of-focus limitations of photolithography at sub-micron dimensions. Also, poor planarity of conductive and dielectric layers promotes poor step coverage which increases sheet-resistance, susceptibility to current-stress failure, electromigration problems and the probability of electrical opens. In addition, poor planarity in underlying conductive or dielectric layers formed earlier in a semiconductor device process further increases the difficulty of establishing planarity in overlying layers formed later in that process.

Another difficulty associated with via formation for multi-level interconnects in sub-micron semiconductor devices is the alignment of upper and lower conductive layers with the aperture formed in the intermediate dielectric layer for a via. This alignment is difficult because of the small distance between device features in sub-micron devices and the reduced tolerance available for alignment errors. Misalignment of a via relative to connected upper and lower conductive layers can lead to reduced device yield, increased via resistance and poor metal coverage in the via. For example, in a standard via, misalignment of the via relative to the lower conductive layer results in overetching into the dielectric underlying the lower layer, thereby increasing the aspect ratio of the via opening and preventing adequate step coverage when later filling the via with metal; the result is a poor contact interface in the via and increased via resistance. Misalignment of an upper conductive layer relative to a via results in overetching, or notching, of the lower layer; the notched lower layer exhibits increased current density and is, thus, more susceptible to failure from electromigration or current stress.

In many semiconductor devices, the layout dimensions of upper and lower conductive layers connecting to vias are extended in the vicinity of the via to form a layout frame, or head, around the via. This is known as framing the via. The frame provides additional alignment margin such that if partial misalignment of an upper and lower conductive layer relative to the intended via location occurs, the actual formed via will still overlie a portion of a lower layer or underlie a portion of an upper layer. However, an adverse effect of using framed vias in a semiconductor device layout is that the layout area is substantially increased.

A third difficulty associated with via formation for multi-level interconnects in sub-micron semiconductor devices is the contact resistance of the vias caused by polymer residue formation during the etching of the vias. These residues are typically formed during plasma etching and may contaminate the bottom of the via, thus causing a poor metallurgical contact between the lower layer and the conductive material of the via.

Accordingly, a need has existed for a method of forming a via for connecting multi-level interconnects in sub-micron semiconductor devices that improves the surface planarity of formed conductive and dielectric layers, reduces problems associated with via misalignment, reduces contact resistance problems associated with polymer residues and lowers associated manufacturing costs.

Commonly-assigned U.S. Pat. No. 5,904,569, which issued to Vassili Kitch (the inventor in this application) on May 18, 1999, discloses a process for forming a via in a semiconductor device that uses a self-aligned metal pillar, to connect conductive layers separated by a dielectric. In accordance with the teaching of the Kitch '569 patent, a first conductive layer is formed on a semiconductor substrate, followed by formation of a second conductive layer on the first conductive layer and a third conductive layer on the second conductive layer. The three conductive layers are then patterned and etched to form a patterned stack of the first, second and third conductive layers. A dielectric material is then deposited to fill the gaps between the patterned stack of the first, second and third layers. The wafer is then planarized, typically using Chemical Mechanical Processes (CMP), to expose the patterned portion of the upper, third conductive layer of the stack. The third conductive layer is then etched, forming a pillar, using the second conductive layer as an etch stop; that is, the etch chemistry etches the third conductive layer, but does not substantially react with the second conductive layer. A second dielectric layer is then deposited to substantially fill the gaps created by the patterning and etching of the third conductive layer. CMP is again used to planarize the wafer and to expose the top of the pillar. A fourth patterned conductive layer is then formed on the wafer overlaying the exposed top of the pillar. The result is an interconnect structure that includes the first and second (etch stop) conductive layers as lower metal, the fourth conductive layer as upper metal and the third patterned conductive layer providing via pillars between lower and upper metal.

Figure 1:
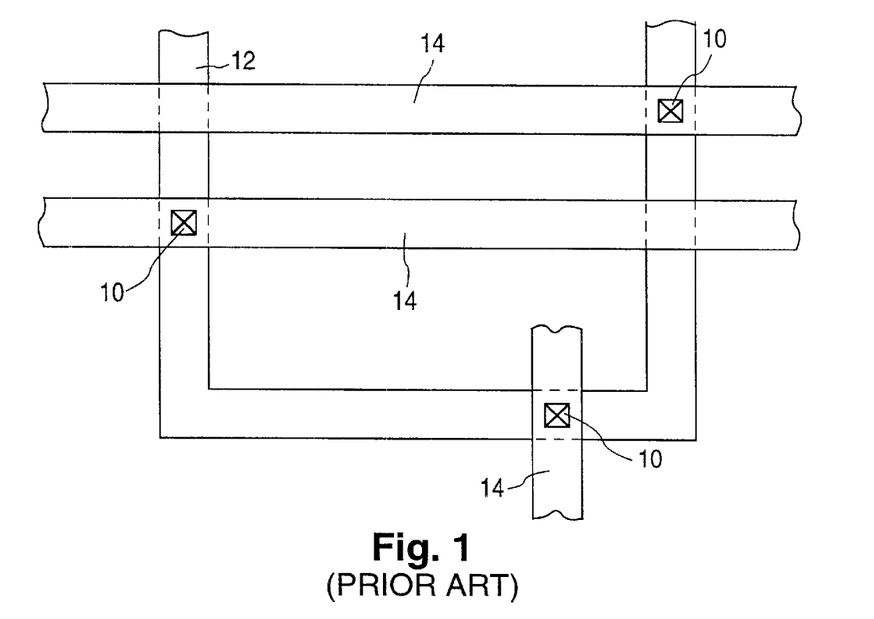
FIG. 1 illustrates a conventional technique for defining vias between a lower conductive layer and an upper conductive layer.

Referring to FIG. 1, as discussed above, accurate alignment of the via hole 10 between a lower metal layer 12 and an upper metal layer 14 can be difficult to achieve. To ensure proper alignment and still maintain acceptable packing density, the size of the etched via hole 10 is often made smaller than the dimensions of the two metal layers, as shown in FIG. 1, leading to the increased via resistance and associated problems discussed above.

Figure 2:
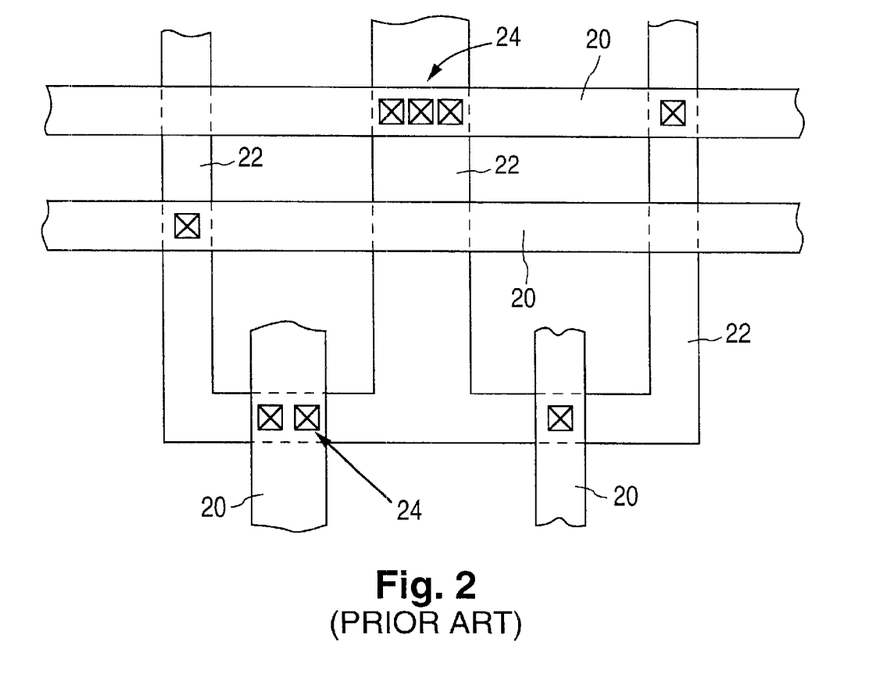
FIG. 2 illustrates a conventional technique for defining vias between an upper conductive layer and a relatively wider lower conductive layer.

FIG. 2 shows an example of upper metal 20 passing over a wider portion of lower metal 22, thus enabling the using of multiple via holes 24 at the intersection of the lower metal 22 and upper metal 24 to help alleviate the via resistance problem.

As evidenced by the above, it would be highly desirable to have available a technique that could provide the maximum allowable via size between upper and lower metal interconnect structures.

SUMMARY OF THE INVENTION

The present invention provides a technique for laying out vias between conductive layers in an integrated circuit structure utilizing existing conventional Metal n and Metal n+1 layout databases. This allows for interconnect vias to always be optimized in size and shape for existing Metal n and Metal n+1 interconnects, thus providing the lowest possible interlayer resistance, which in turn provides the best possible circuit performance and reliability.

That is, in accordance with the present invention, a first database (Metal n) is created that defines a lower conductive layer. A second database (Metal n+1) is created that defines an upper conductive layer. Selected intersections of the first and second databases are then defined to create a third database (via n) that defines a via pattern between the lower conductive layer and the upper conductive layer.

Further objects and advantages of the present invention will become apparent from the following detailed description and accompanying drawings.

BRIEF DESCRIPTION OF THE DRAWINGS

FIGS. 6 through 11a–11c illustrate a method, in structural cross-section, in accordance with an embodiment of the present invention.

DETAILED DESCRIPTION OF THE INVENTION

Figure 3:
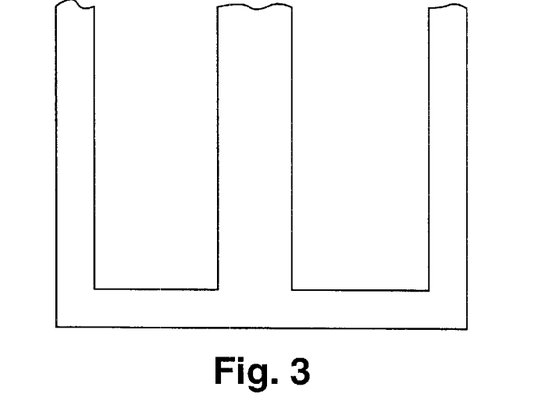
FIG. 3 is a pictoral representation of a layout of a lower conductive layer defined by a first database.
Figure 4:
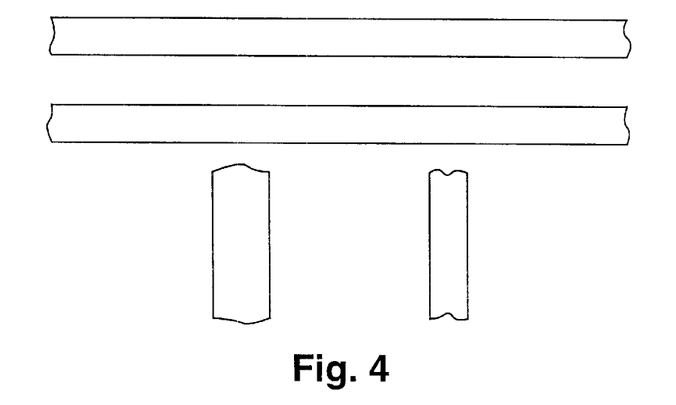
FIG. 4 is a pictoral representation of a layout of an upper conductive layer defined by a second database.
Figure 5:
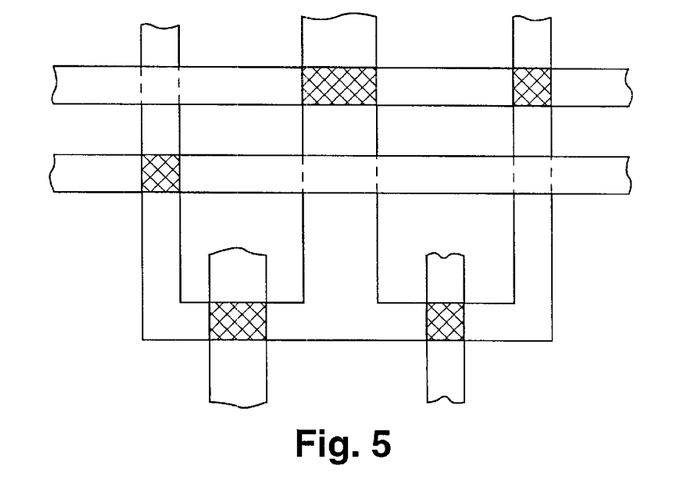
FIG. 5 is a pictoral representation of a layout of a pattern of vias defined by selected intersections of the first database and the second database.

The present invention is directed to a method of forming a database that defines vias between a lower conductive layer and an upper conductive layer in an integrated circuit structure. Methods of creating databases for the photolithographic masks used in fabricating integrated circuit structures are well known in the art and are not considered, in and of themselves, an aspect of the present invention. It is the utilization of mask databases in a particular way in accordance with the invention that the inventor believes to be unique. More specifically, in accordance with the present invention, a first database is created that defines a lower conductive layer (see, for example, FIG. 3) in an integrated circuit structure. A second database is created that defines an upper conductive layer (see, for example, FIG. 4) in the integrated circuit structure. Selected intersections of the first database and the second database, i.e. data that defines selected areas that are common to the two databases, are then utilized to create a third database. The third database defines a pattern of vias between the lower conductive layer and the upper conductive layer (see, for example, FIG. 5). The three databases are then utilized to form an interconnect structure in the integrated circuit structure.

An embodiment of the present invention is illustrated in FIGS. 6 through 11a–11c.

More specifically, FIGS. 6 through 11a–11c illustrate, in cross-section, a method of forming a self-aligned aluminum pillar for use as a conductive via post to connect upper and lower conductive interconnect layers in a semiconductor device using double-metal in accordance with the concepts of the present invention. (Those skilled in the art will appreciate that although the embodiment of the invention discussed below utilizes an aluminum interconnect technology, the concepts of the invention are also applicable to any interconnect technology, including but not limited to polysilicon and copper interconnect structures.)

Figure 6:
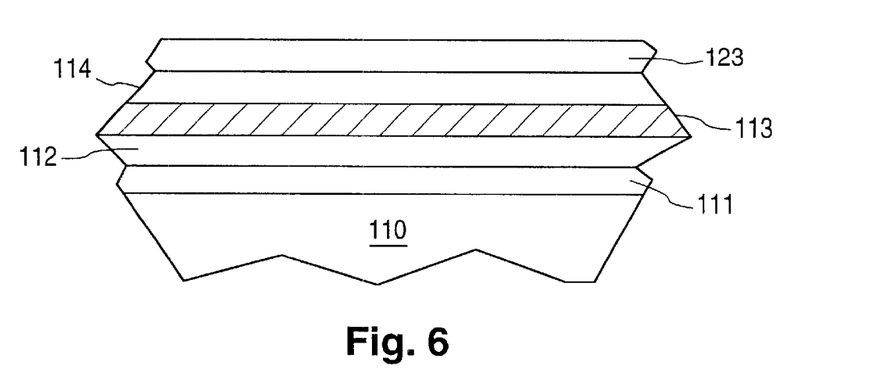
Figure 7:
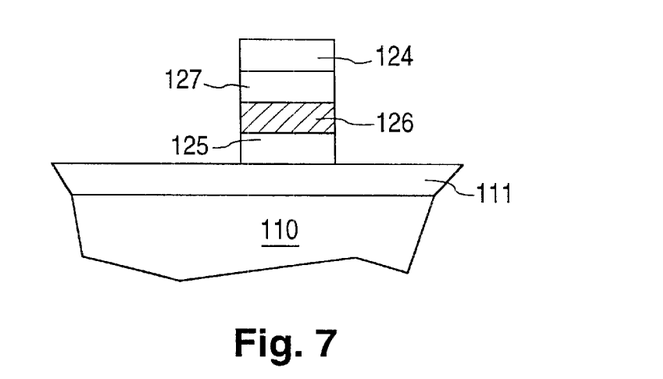

In the illustrated Embodiment of the invention, a first oxide layer 111 is deposited overlying a semiconductor substrate 110, and a first aluminum layer 112 is deposited over the first oxide layer 111. Next, a layer of titanium nitride 113 is deposited overlying the first aluminum layer 112. Finally, a second layer of aluminum is deposited overlying the titanium nitride layer 113. The first aluminum 112, titanium nitride 113 and the second aluminum 114 stack then coated with photoresist 123 as shown in FIG. 6. The photoresist is patterned and etched utilizing a lower conductive layer mask (not shown) to provide a first aluminum portion 125, a titanium nitride portion 126 and a second aluminum portion 127 as desired for the lower layer of metal interconnect, as shown in FIG. 7. The patterning and etching of the conductive stack is performed utilizing a lower conductive layer mask formed from a lower conductive layer database constructed in accordance with techniques well known to those skilled in the art.

Figure 8:
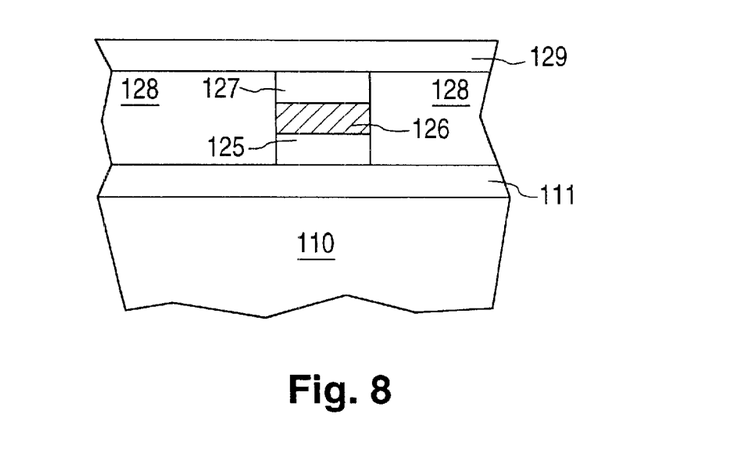

Referring to FIG. 8, following etching of the conductive stack, a second layer of oxide 128 is deposited overlying the exposed first oxide layer 111 and filling the gaps between the first aluminum portion 125, the titanium nitride portion 126 and the second aluminum portion 127. The wafer is then planarized using a Chemical Mechanical Process (CMP) to planarize the wafer and to expose the top of the second aluminum portion 127. A layer of photoresist 129 is then formed on the aluminum 127 and oxide 128.

Figure 9:
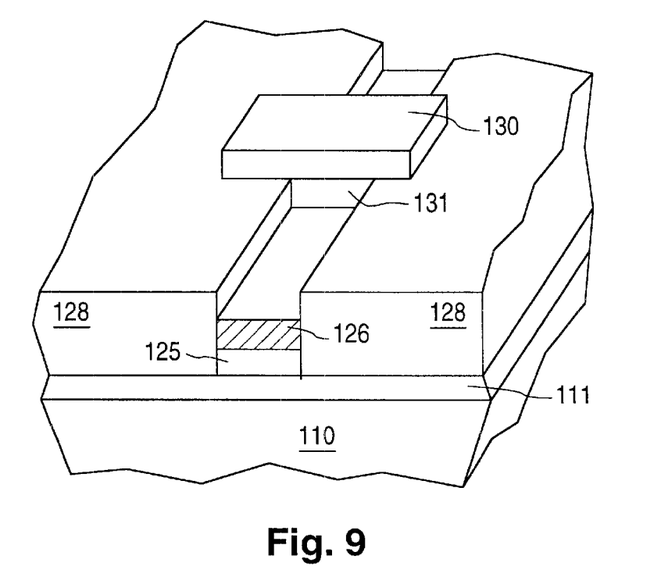

After photoresist 129 has been patterned, the second aluminum portion is etched as shown in FIG. 9 to form pillar 131, using the titanium nitride portion 126 as an etch stop. In accordance with the present invention, the second aluminum portion 127 is patterned and etched using the intersection between the lower conductive layer database and an upper conductive layer database that will be utilized to define an upper level interconnect structure, to be described in detail below.

Figure 10:
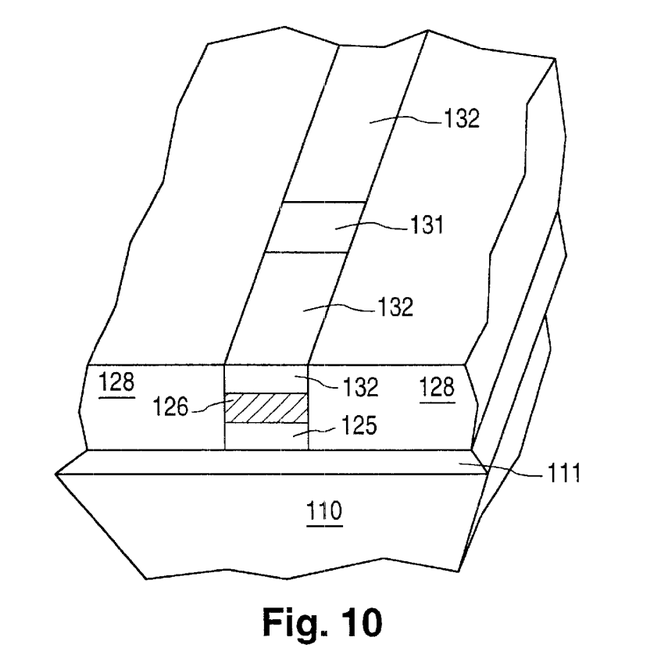

Next, as shown in FIG. 10, a third layer of oxide 132 is deposited overlying the wafer and filling the gaps created by the etching of the second aluminum portion 127. The wafer is then planarized using CMP to expose the top of the pillar 131.

Figure 11A:
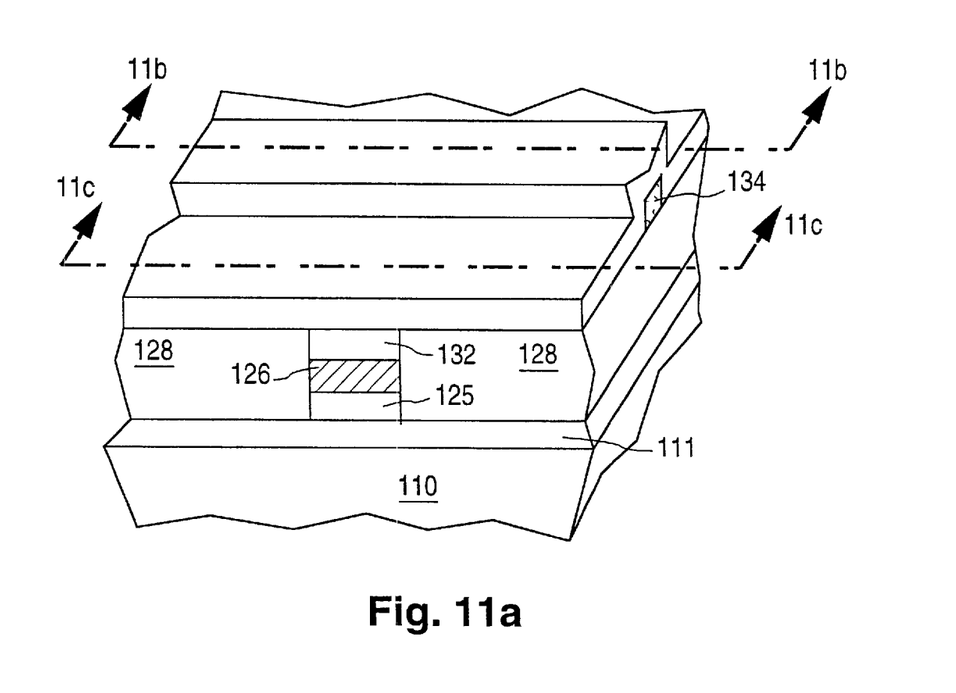
Figure 11B:
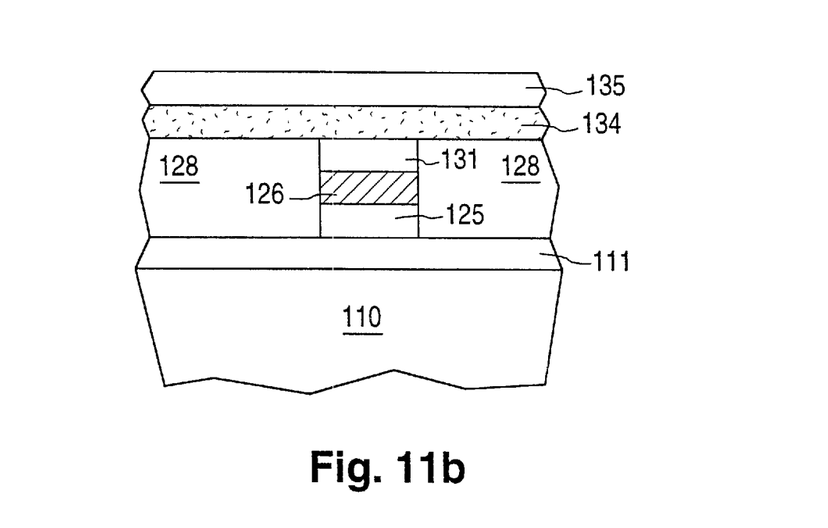

A third layer of aluminum 134 is then deposited overlying the second 128 and third 132 oxide layers to contact the top surface of the pillar 131 as shown in FIGS. 11a and 11b, thus connecting two levels of metal interconnect in the semiconductor device. The third layer of aluminum 134 is patterned and etched utilizing a mask created utilizing an upper conductive layer database created in accordance with techniques well-known to those skilled in the art.

More specifically, referring back to FIG. 6, a first oxide layer 111 is formed overlying a silicon substrate 110. Even though only first oxide layer 111 is shown formed overlying substrate 110, it is possible for numerous structures such as field oxide regions, polysilicon regions, metal regions and active device regions to underlie first oxide 111. These underlying structures do not directly affect the practice of the invention because first oxide layer 111 is planarized using an etch back method, spin on glass (SOG), reflow (CMP) or similar processing before forming overlying layers thereon. For example, first oxide layer 111 can be a deposited borophosphatesilicate glass (BPSG) layer planarized by an etch back with a photoresist as is well known. Next in the process, a first aluminum layer 112 is deposited overlying the first oxide layer 111, a titanium nitride layer 113 is deposited overlying the first aluminum layer 112, and a second aluminum layer 114 is deposited overlying the titanium nitride layer 113. A photoresist layer 123 is deposited on the surface of the second aluminum layer 114.

Referring to FIG. 7, photoresist layer 123 has been patterned using the lower conductive layer mask and conventional photolithographic techniques leaving a photoresist portion 124. The first and second aluminum layers 112 and 114 have been anisotropically etched using a chlorine-based chemistry such as $Cl_2$, $BCl_3$ or HCl and the titanium nitride layer 113 has been etched using a fluorine-based chemistry such as $SF_6$, $CF_4$ or $NF_3$, using the photoresist portion 124 as an etch mask, leaving a first aluminum portion 125, with a titanium nitride portion 126 on top of the first aluminum portion 125 and a second aluminum portion 127 on top of the titanium nitride portion 126 in a stack. As discussed above, the pattern etched into the first aluminum portion 125 is the pattern desired for the first layer of metal interconnect and as reflected by the lower conductive layer mask. Following this etching step, regions of first oxide layer 111 not covered by the first aluminum portion of 125 are exposed.

Because photoresist portion 124 must remain intact during the etching of first and second aluminum layers 112 and 114 as well as titanium nitride layer 113, in other embodiments of the invention it may be desirable to use a conventional hard mask to reinforce photoresist portion 124 during this etching process, as is known in the art.

Referring to FIG. 8a, second oxide layer 128 is then deposited overlying the exposed first oxide layer 111, filling the gaps between the stacked pattern portions of the first and second layers of aluminum and titanium nitride 125, 127 and 126, respectively, using High Density Plasma (HDP) oxide deposition or SOG. Second oxide layer 128 is then planarized using CMP as known in the art to planarize the surface thereof to expose the top of the stacked patterned portions of the first and second layer of aluminum and titanium nitride layer 125, 127 and 126, respectively. A photoresist layer 129 is then deposited on the surface of the planarized second aluminum portion 127 and the second oxide layer 128.

Referring to FIG. 9, photoresist layer 129 has been patterned using a mask which represents, as discussed above, selected intersections between the lower conductive layer mask and the upper conductive layer mask to be utilized in forming the upper conductive layer of the interconnect structure. That is, photoresist layer 29 has been patterned using this novel mask and conventional photolilthographic technology leaving a photoresist portion 130. The second aluminum portion 127 has been anisotropically etched using a chlorine-based chemistry such as $Cl_2$, $BCl_3$, or HCl leaving a pillared second aluminum portion 131. The etch chemistry used to etch the second aluminum portion 127 is substantially unreactive with the titanium nitride portion 126 and, thus, the titanium nitride portion 126 acts as an etch stop during this etching. Following the etching of the second aluminum portion 127, the top surface of the titanium nitride portions 126 not covered by the pillared second aluminum portion 131 are exposed. Thus, a self-aligned aluminum pillar is formed which connects a first level of metal interconnect and a second level of interconnect to be formed later in the process. The formed aluminum pillar adheres well to the underlying titanium nitride layer without any induced stresses in the pillar; thus, problems with pillar deformation or flaking are avoided.

Some regions of the top surface of the titanium nitride portion 126 will be exposed after the underlying regions of second aluminum portion 127 not protected by photoresist portion 130 are removed during etching, although the etch chemistry used is substantially unreactive with titanium nitride, some of the titanium nitride portion 126 will gradually be removed after its top surface is this exposed. Therefore, titanium nitride portion 126 must be sufficiently thick to protect underlying first aluminum portion 125 until the regions of second aluminum portion 127 are completely etched away. For example, the chemistry's selectivity ratio for aluminum relative to titanium nitride is about 10:1. Thus, the thickness of titanium nitride portion 126 must be about one-tenth or more the thickness of the overetch of the second aluminum portion 127 in order to protect the first aluminum portion 125 during etching.

Referring to FIG. 10, a third oxide layer 132 is then deposited overlying the exposed titanium nitride portion 126, filling the gaps, resulting from pillared second aluminum portion formation 131, using HDP oxide deposition or SOG. The third oxide layer 132 is then planarized using CMP processes to expose the top of the pillared second aluminum portion 131.

Figure 11C:
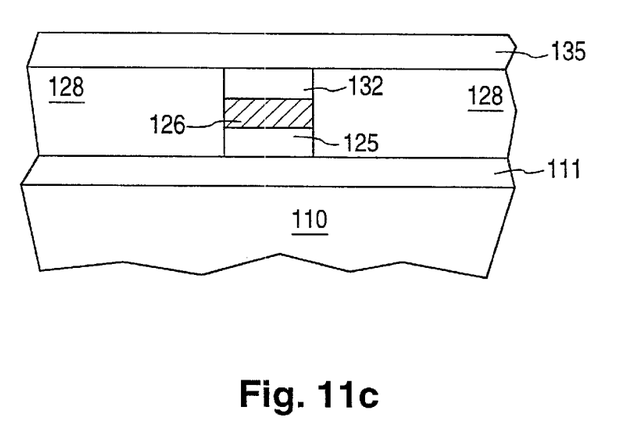

Referring to FIGS. 11a–11c, a third aluminum layer is then deposited overlying the third oxide layer 132 and the exposed surfaces of the pillared second aluminum portion 131 to make electrical contact. The third aluminum layer is then patterned using photoresist to form a third aluminum portion 134. As discussed above, this third aluminum layer is patterned utilizing an upper conductive layer mask formed in accordance with an upper conductive layer database created in accordance with concepts well known to those skilled in the art. Because underlying third oxide layer 132 has been planarized and only a relatively thin portion of pillared second aluminum portion 131 protrudes above the surface of third oxide layer 132, the third aluminum layer is deposited with substantially uniform thickness, coverage and surface planarity. A passivation layer 135 is formed overlying the exposed regions of third oxide layer 132 and third aluminum portion 134.

Figure 12:
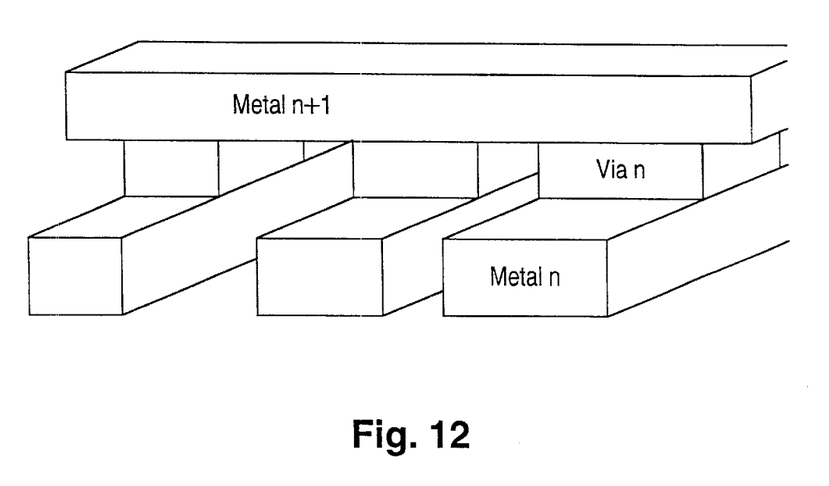
FIG. 12 is a pictoral representation of an interconnect structure formed in accordance with the present invention.

FIG. 12 shows an interconnect structure resulting from the above described process in which lower metal (Metal n) is connected to upper metal (Metal n+1) by conductive vias (Via n).

It should be noted that all metal, photoresist and dielectric layers deposited in the practice of the embodiment of the invention described above can be deposited onto substantially planar underlying surfaces or etched back in a planarization step, thus increasing the manufacturability and reliability of the formed semiconductor device. It is well recognized that maintaining planarization during the formation of multi-level interconnection is critical to the successful manufacture of sub-micron semiconductor devices.

Although the practice of the invention has been illustrated for double-level metal semiconductor devices, the invention can be practiced to form any number of levels of metal interconnect in a multi-level semiconductor device, and such practice is considered to be within the scope of the invention. Also, the dielectric layers used in other embodiments could be any number of low temperature oxides or nitrides such as phosphosilicateglass (PSG), borosilicateglass (BSG), borophosphosilicateglass (BPSG), plasma-enhanced oxide (PEO), plasma-enhanced nitride (PEN), or low K dielectrics.

In other embodiments of the invention, some or all of the metal layers used in the practice of the invention can be formed from different metals. For example, the pillars could be formed from aluminum, the etch stop metal at the base of the pillars could be formed from tungsten, and the layers of metal interconnect could be formed from titanium or a titanium-tungsten alloy. Aluminum, tungsten, titanium, titanium nitride, tantalum, tantalum nitride, or combinations thereof could be used in other parts of the formed semiconductor device. There are many combinations of metals that all fall within the scope of the invention.

Various other modifications and alterations of the present invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the invention and that methods within the scope of these claims and their equivalents be covered thereby.

What is claimed is:

1. A method of forming a via mask database that defines vias between a lower metal layer and an upper metal layer in an integrated circuit structure, the method comprising:

creating a first database that defines the lower metal layer;

creating a second database that defines the upper metal layer; and utilizing selected intersection of the first database and the second database to create a third database, such that the third database defines a pattern of vias between the lower metal layer and the upper metal layer.

2. A method of forming conductive vias between a lower conductive layer and an upper conductive layer in an integrated circuit structure, the method comprising:

creating a first database that defines the lower conductive layer;

creating a second database that defines the upper conductive layer;

utilizing selected intersections of the first database and the second database to create a third database, the third database defining a pattern of vias between the lower conductive layer and the upper conductive layer;

using the first database to form the lower conductive layer;

using the third database to form the pattern of vias;

forming conductive via pillars in the vias; and using the second database to form the upper conductive layer.

3. A method for forming a pattern of conductive vias between a lower conductive layer and an upper conductive layer in an integrated circuit structure, the method comprising:

creating a first database that defines the lower conductive layer;

creating a second database that defines the upper conductive layer;

utilizing selected intersections of the first database and the second database to create a third database, the third database defining the pattern of vias between the lower conductive layer and the upper conductive layer;

providing a semiconductor structure;

forming a first conducting layer overlying the semiconductor structure;

forming a second conducting layer of a material different from the first conducting layer overlying the second conducting layer;

forming a third conducting layer of a material different from the second conducting material overlying the second conducting layer;

utilizing the first database to etch the first, second and third conducting layers concurrently to form a patterned stack portion of the first, second and third conducting layers and exposing portions of the semiconductor structure;

forming a first dielectric layer overlying the exposed portions of the semiconductor structure such that the first dielectric layer fills gaps created by the etching of the first, second and third conducting layers;

planarizing the first dielectric layer to expose a top surface of the patterned portion of the third conducting layer;

using the third database to etch a portion of the third conducting layer using the second conducting layer as an etch step to form a pattern of via pillars, wherein the etching selectively etches the third conductive layer relative to the second conductive layer;

forming a second dielectric layer such that the second dielectric layer fills gaps created by the etching of the third conducting layer;

planarizing the second dielectric material to expose a top surface of the pattern of via pillars; and using the second database to form a patterned fourth conducting layer overlying the exposed top surface of the pattern of via pillars.

* * * * *